United States Patent
Liau et al.

(10) Patent No.: US 9,748,433 B1
(45) Date of Patent: Aug. 29, 2017

(54) METHOD FOR RECOVERING EFFICACY OF SOLAR CELL MODULE AND PORTABLE DEVICE THEREOF

(71) Applicant: GINTECH ENERGY CORPORATION, Miaoli County (TW)

(72) Inventors: Chung-Chi Liau, Miaoli County (TW); Chung-Chi Liu, Miaoli County (TW); Yan-Kai Chiou, Miaoli County (TW); Kang-Cheng Lin, Miaoli County (TW); Kuei-Wu Huang, Miaoli County (TW)

(73) Assignee: GINTECH ENERGY CORPORATION, Miaoli County (TW)

( * ) Notice: Subject to any disclaimer, the term of this patent is extended or adjusted under 35 U.S.C. 154(b) by 0 days.

(21) Appl. No.: 15/206,328

(22) Filed: Jul. 11, 2016

(30) Foreign Application Priority Data

May 16, 2016 (CN) .......................... 2016 1 0324262

(51) Int. Cl.
    *H01L 31/18* (2006.01)
(52) U.S. Cl.
    CPC ........ *H01L 31/186* (2013.01); *H01L 31/1864* (2013.01)
(58) Field of Classification Search
    None
    See application file for complete search history.

(56) References Cited

U.S. PATENT DOCUMENTS 9,190,556 B2 * 11/2015 Wenham ............. H01L 31/1864

2009/0236217 A1 * 9/2009 Chao ..................... C23C 14/086
    204/192.11
2014/0090638 A1 * 4/2014 Grushkowitz .......... B23P 11/00
    126/605

FOREIGN PATENT DOCUMENTS

WO      2013173867 A1    11/2013

OTHER PUBLICATIONS

Lihui Song et al., "Laser Enhanced Hydrogen Passivation of Silicon Wafers," International Journal of Photoenergy, vol. 2015, 13 pages.
Marcus Glaser et al.,"Towards a quantitative model for BO regeneration by means of charge state control of hydrogen", Energy Procedia, 5th International Conference on Silicon Photovoltaics, SiliconPV 2015, 7 pages.

(Continued)

*Primary Examiner* — Bilkis Jahan
(74) *Attorney, Agent, or Firm* — CKC & Partners Co., Ltd.

(57) ABSTRACT

The present disclosure provides a method for recovering the efficacy of solar cell modules and a device thereof. The method includes providing a solar cell module and scanning the solar cell module with a light-beam. The light-beam has a power density between 20 W/cm² and 200 W/cm², a width between 1 mm and 156 mm. The light-beam scans a solar cell module with a scanning speed between 50 mm/sec and 200 mm/sec. Furthermore, the present disclosure also provides a portable device for recovering the efficacy of solar cell modules. The portable device includes two types such as placed type and hand-held type. The aforementioned devices can perform a hydrogenating process on solar cell modules to improve the degree of light-induced degradation (LID) so as to improve the photovoltaic conversion efficiency of solar cell modules.

3 Claims, 5 Drawing Sheets

(56) References Cited

OTHER PUBLICATIONS

Brett J. Hallam et al., "Advanced hydrogenation of dislocation clusters and boron-oxygen defects in silicon solar cells", Energy Procedia, 5th International Conference on Silicon Photovoltaics, SiliconPV 2015, 10 pages.

* cited by examiner

METHOD FOR RECOVERING EFFICACY OF SOLAR CELL MODULE AND PORTABLE DEVICE THEREOF

RELATED APPLICATIONS

This application claims priority to Chinese Application Serial Number 201610324262.2, filed May 16, 2016, which is herein incorporated by reference.

BACKGROUND

Field of the Invention

The present disclosure relates to a method for recovering the efficacy of solar cell modules and a portable device thereof.

Description of Related Art

Solar cell is an environmentally friendly energy, which can directly transform solar energy into electrical energy. Existed solar cells, based on the main material, can be divided into silicon-based semiconductor solar cells, dye-sensitized solar cells, organic solar cells and other types of solar cells. Silicon-based semiconductor solar cell has the highest photovoltaic conversion efficiency and a low-cost advantage.

However, silicon substrates of silicon-based semiconductor solar cells usually have higher density of lattice defects and higher concentration of impurities. These impurities, such as oxygen, may further combine with the dopants, such as boron, doped into the silicon substrate to form positively-charged compounds, such as boron-oxygen compounds. In this way, in electricity-generating process of solar cell module having silicon-based semiconductor solar cells, these lattice defects or the positively-charged compounds will capture the electrons generated by light, which is called light-induced degradation (LID) phenomena. These phenomena will dramatically decrease photovoltaic conversion efficiency of solar cell modules, and the phenomena will be more seriously as increasing usage time. Generally, after used for 1 year, the photovoltaic conversion efficiency of the solar cell modules decreases to a degree of 3% to 20%. Therefore, a method for recovering the efficacy of solar cell modules and a device thereof are needed to solve the aforementioned problems.

SUMMARY

To solve the aforementioned problems, the present disclosure provides a method for recovering an efficacy of a solar cell module and a portable device thereof.

One aspect of the present disclosure provides a method for recovering an efficacy of a solar cell module. The method includes providing a solar cell module and scanning the solar cell module with a light-beam. The light-beam has a power density between 20 W/cm$^2$ and 200 W/cm$^2$, a width between 1 mm and 156 mm, and a scanning speed between 50 mm/sec and 200 mm/sec.

According to some embodiments of the present disclosure, the light-beam has a wavelength between 450 nm and 1100 nm.

According to some embodiments of the present disclosure, the method further includes heating the solar cell module up to a temperature between room temperature and 400° C.

One aspect of the present disclosure provides a portable device for recovering an efficacy of a solar cell module. The device includes: a dam structure having two trenches disposed on an inner sidewall of the dam structure in parallel; a plate structure, two ends of the plate structure connected to two moving devices respectively, and the moving devices in the trenches; a light-beam generator disposed at a lower surface of the plate structure; and a power supply disposed on sidewalls of the dam structure and electrically connected to the light-beam generator and the moving devices.

According to some embodiments, the device further includes a heating device disposed at one side or two sides of the light-beam generator.

According to some embodiments, the device further includes a control device disposed on sidewalls of the dam structure and electrically connected to the light-beam generator and the moving devices.

One aspect of the present disclosure provides a portable device for recovering an efficacy of a solar cell module. The device includes a plate structure, a light-beam generator and a power supply. The light-beam generator is disposed at a lower surface of the plate structure. The power supply is disposed on an upper surface of the plate structure and electrically connected to the light-beam generator.

According to some embodiments, the device further includes a heating device disposed at one side or two sides of the light-beam generator.

According to some embodiments, the device further includes a L-shape structure connected to the lower surface of the plate structure.

According to some embodiments, the device further includes a heating device disposed on an upper surface of a lower portion of the L-shape structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
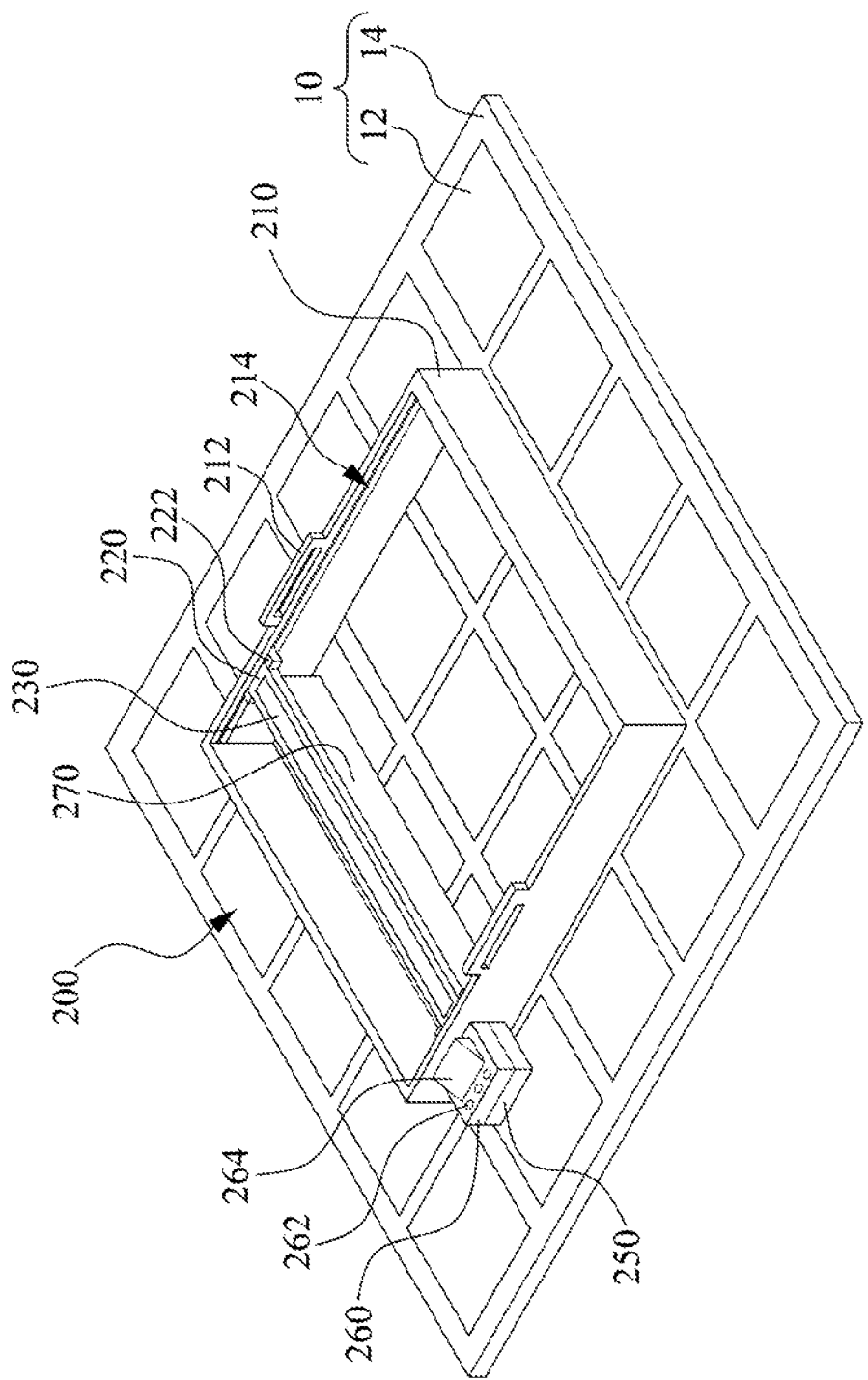
FIG. 1 illustrates a 3D view of a portable device for recovering an efficacy of a solar cell module, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "top," "bottom," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Si substrates are usually used in solar cell modules, however, the Si substrates has high concentration of defects or impurities. Or, when P-type impurities, such as B, are doped into the Si substrates, B ions combine with Si ions of the Si substrates to form positively-charged $BO^+$ compounds. In photovoltaic conversion processes, these defects, impurities or positively-charged $BO^+$ compounds trap moving electrons so as to decrease photovoltaic conversion efficiency, which is called light-introduced degradation (LID).

The present disclosure provides a method for recovering the efficacy of a solar cell module and a portable device for recovering the efficacy of a solar cell module to improve the degree of LID of the solar cell module so as to elevate its efficacy. The method is exciting hydrogen ions of the solar cell module to a higher energy band by a light-beam so that the hydrogen ions can diffuse to the aforementioned defects, impurities or positively-charged $BO^+$ compounds to neutralize the charge or passivate the defects. In this way, electrons will not be trapped by these positively-charged compounds or defects in the photovoltaic conversion process, and thus the photovoltaic conversion efficiency of the solar cell module can be improved or recovered and the degree of LID can be decreased.

Please refer to FIG. 1, which illustrates a 3D view of a solar cell module 10 and a portable device for recovering the efficacy of a solar cell module, in accordance with some embodiments in the present disclosure. As shown in FIG. 1, the solar cell module 10 includes a solar cell 12 and a sealing material 14. In the embodiment, the solar cell 12 can be, but not limited to, P-type Si-substrate solar cell. In some embodiments, the solar cell module 10 further includes a transparent layer (not shown) over the solar cell 12 to provide protection for the solar cell 12. In some embodiments, the solar cell 12 includes a hydrogen ion source layer (not shown), which can be formed by any doping ways to dope hydrogen ions into a passivation layer (not shown) of the solar cell 12, and the doping ways may be ion implantation and plasma doping. It should be noticed that the solar cell module 10 may be various solar cell modules including various structures, which is not limited to what shown in FIG. 1. For simplicity, the present disclosure does not make further description about the solar cell module 10.

The present disclosure provides two types of portable devices for recovering the efficacy of a solar cell module: placed type and hand-held type. In the following descriptions, the placed type portable device for recovering the efficacy of a solar cell module is abbreviated as placed type device, while the hand-held type portable device for recovering the efficacy of a solar cell module is abbreviated as hand-held type device. The placed type device has a frame structure and can be directly disposed on solar cell modules, while the hand-held type device can perform the hydrogenating process for recovering the efficacy with any angle according to installation position of the solar cell modules. Then, the placed type device (FIG. 1 and FIG. 2) is described first, and the hand-held type device (FIGS. 3 through 5) is described subsequently.

Please continue referring to FIG. 1, which illustrates a 3D view of a placed type device 200, in accordance with some embodiments in the present disclosure. The placed type device 200 is disposed over the solar cell module 10 for performing a hydrogenating process to the solar cell module 10 to passivate the aforementioned defects, impurities or positively-charged compounds so that the photovoltaic conversion efficiency of the solar cell module 10 can be increased. In some embodiments, the placed type device 200 includes a dam structure 210, a hand-held device 212, a sliding rail 214, a supporting plate 220, a moving device 222, a light-beam generator 230, a power supply 250 and a control device 260. The power supply 250 is disposed over outer sidewalls of the dam structure 210 and is electrically connected to the moving device 222, the light-beam generator 230 and the control device 260 by circuits (not shown) disposed in the dam structure 210 and the supporting plate 220. The moving device 222 is disposed within the sliding rail 214 and is capable of driving the light-beam generator 230 with a constant rate so that a light-beam 270 generated by the light-beam generator 230 can scan the solar cell module 10 with a constant scanning speed. Furthermore, the control device 260 can precisely control the power density, wavelength and width of the light-beam 270 generated by the light-beam generator 230 and the moving speed (i.e. the scanning speed of the light-beam 270) of the moving device 222. It should be noticed that the "width" herein represents the width of the light-beam 270 parallel to the scanning direction. The scanning speed, power density, wavelength and width of the light-beam 270 will be described in details latter. In some embodiments, the control device 260 is equipped with a control button 262 and a display screen 264 thereon so that users can modulate the aforementioned scanning speed, power density, wavelength and width according to real requirements. Moreover, the power supply 250 can be a power storage device itself, and supply power to other components. Or the power supply 250 may include a power connector (not shown) to be electrically connected to external power source (not shown) for receiving AC from the external power source and converting it into DC to supplied to other components. Users can easily move and dispose the placed type device 200 through the hand-held device 212, for example, a handgrip.

In other embodiments, the placed type device 200 further includes a transparent or an opaque cover plate over the dam structure 210 to seal the upper opening of the dam structure 210 for preventing pollutants entering into the dam structure 210 during the hydrogenating process, that disturbs or decrease the recovering degree of the photovoltaic conversion efficiency of the solar cell module. It should be noticed that FIG. 1 is not used to restrict the relative positions of the components of the placed type device 200 in the present disclosure.

Figure 2:
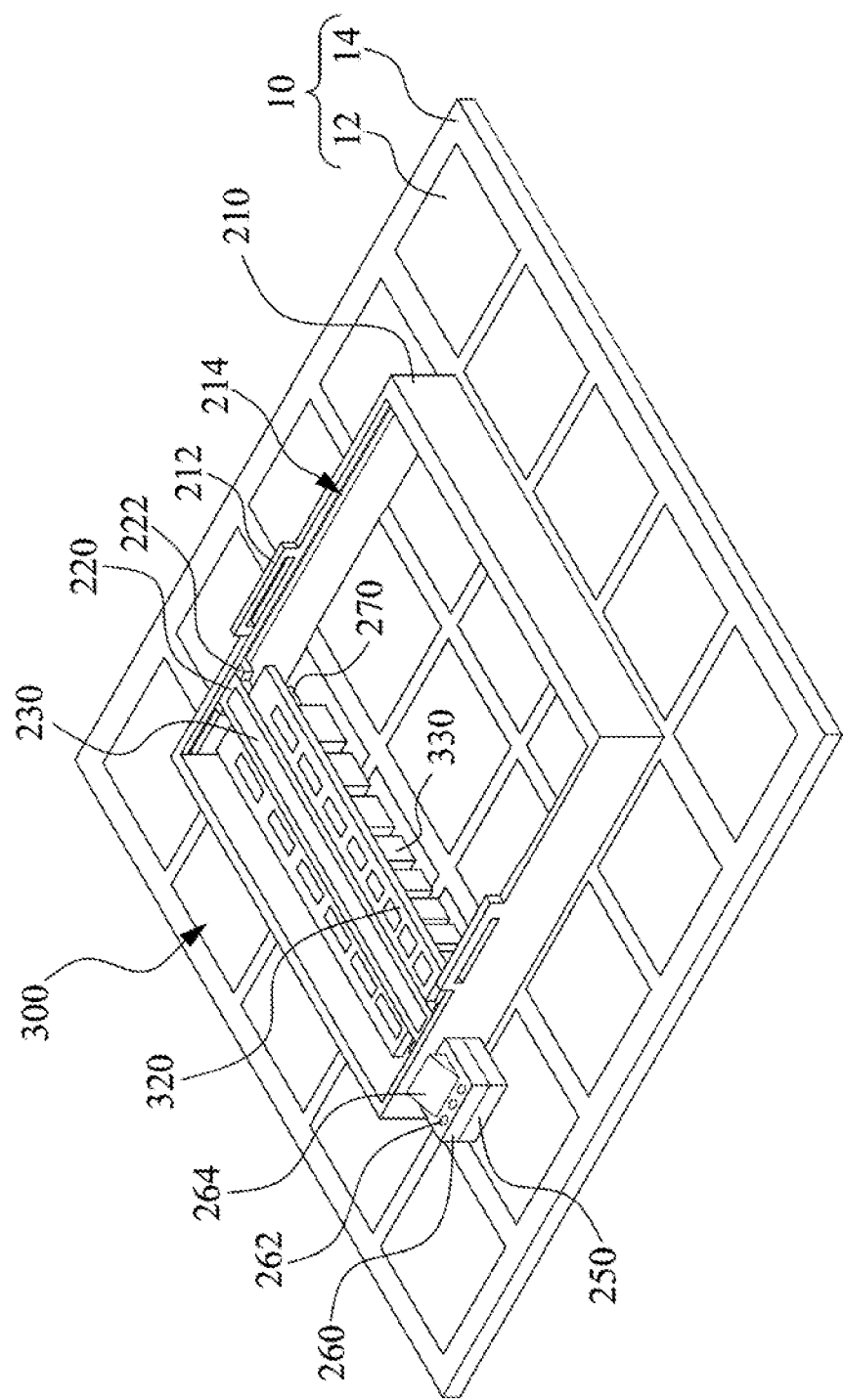
FIG. 2 illustrates a 3D view of a portable device for recovering an efficacy of a solar cell module, in accordance with some embodiments of the present disclosure.

Please refer to FIG. 2, which illustrates a 3D view of a placed type device 300, in accordance with some embodiments in the present disclosure. As shown in FIG. 2, the placed type device 300 includes a dam structure 210, a hand-held device 212, a sliding rail 214, a supporting plate 220, a moving device 222, a light-beam generator 230, a power supply 250 and a control device 260, a second supporting plate 320 and a heating device 330. Different from the placed type device 200, the placed type device 300 further includes the heating device 330. In some embodiments, the heating device 330 is disposed at the lower surface of the second supporting plate 320, and the heating device 330 is electrically connected to the power supply 250 and the control device 260. The second supporting plate 320 and the supporting plate 220 are coplanar and directly in contact with each other. Furthermore, the lower surface of the heating device 330 is higher than, but can be closed to, the lower surface of the dam structure 210 for shortening the distance between the heating device 330 and the solar cell module 10 so that the time taken for heating to a predetermined temperature can be shortened. In the embodiment, the heating devices 330 are disposed on the two sides of the light-beam generator 230. In other embodiment only one side of the light-beam generator 230 has the heating device. It should be noticed that, the heating device is used for locally heating the solar cell module 10 for further adjusting the recovering degree of the photovoltaic conversion efficiency of the solar cell module. The heating temperature of the heating device 330 will be described in details latter.

In other embodiments, the placed type device 300 further includes a transparent or opaque cover plate over the dam structure 210 to seal the upper opening of the dam structure 210 for preventing pollutants entering into the dam structure 210 during the hydrogenating process that disturbs or decrease the recovering degree of the photovoltaic conversion efficiency of the solar cell module. Furthermore, the cover plate, the dam structure 210 and the solar cell module 10 forms an enclosed space so that the heating device 330 can homogeneously heat the solar cell module 10 within the dam structure 210. In this way, the heating device 330 can be disposed at any position of inner sidewalls of the dam structure 210 to heat the entire air within the dam structure 210 so that the solar cell module 10 can reach a homogeneous temperature. It should be noticed that FIG. 2 is not used to restrict the relative positions of the components of the placed type device 300 in present disclosure.

Figure 3:
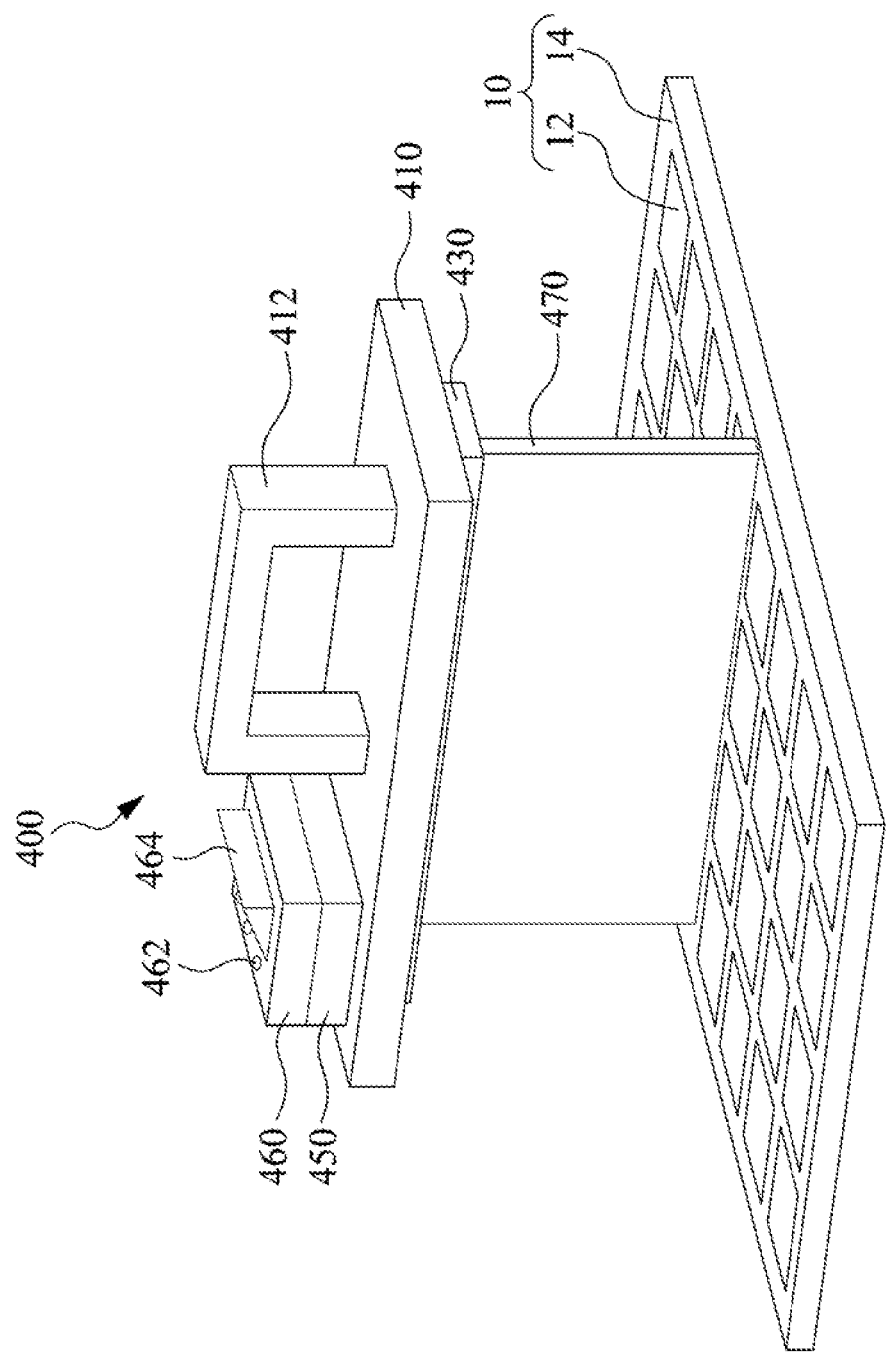
FIG. 3 illustrates a 3D view of a portable device for recovering an efficacy of a solar cell module, in accordance with some embodiments of the present disclosure.

Please refer to FIG. 3, which illustrates a 3D view of a hand-held type device 400, in accordance with some embodiments in the present disclosure. As shown in FIG. 3, the hand-held type device 400 includes a supporting plate 410, a hand-held device 412, a light-beam generator 430, a power supply 450 and a control device 460. The power supply 450 is disposed on the upper surface of the supporting plate 410 and is electrically connected to the light-beam generator 430 and the control device 460 by circuits (not shown) in the supporting plate 410. The control device 460 can precisely control the power density, wavelength and width of the light-beam 470 generated by the light-beam generator 430. It should be noticed that the "width" herein represents the width of the light-beam 470 parallel to the scanning direction. The power density, wavelength and width of the light-beam 470 will be described in details latter. In some embodiments, the control device 460 is equipped with a control button 462 and a display screen 464 thereon so that users can modulate the aforementioned power density, wavelength and width according to real requirements. Moreover, the power supply 450 can be a power storage device itself to supply power to other components. Or the power supply 450 may include a power connector (not shown) to be electrically connected to external power source (not shown) for receiving AC from the external power source and converting it into DC, which can be supplied to other components. Users can easily move and dispose the hand-held type device 400 through the hand-held device 412, for example, a handgrip. It should be noticed that a moving speed (i.e. a scanning speed of the light-beam 470) can be arbitrarily adjusted by users according to real requirements on spot. Furthermore, the hand-held type device 400 can be more flexibly used in more complicated spots, such as tiny working space or solar cell modules with high tilted angle.

Figure 4:
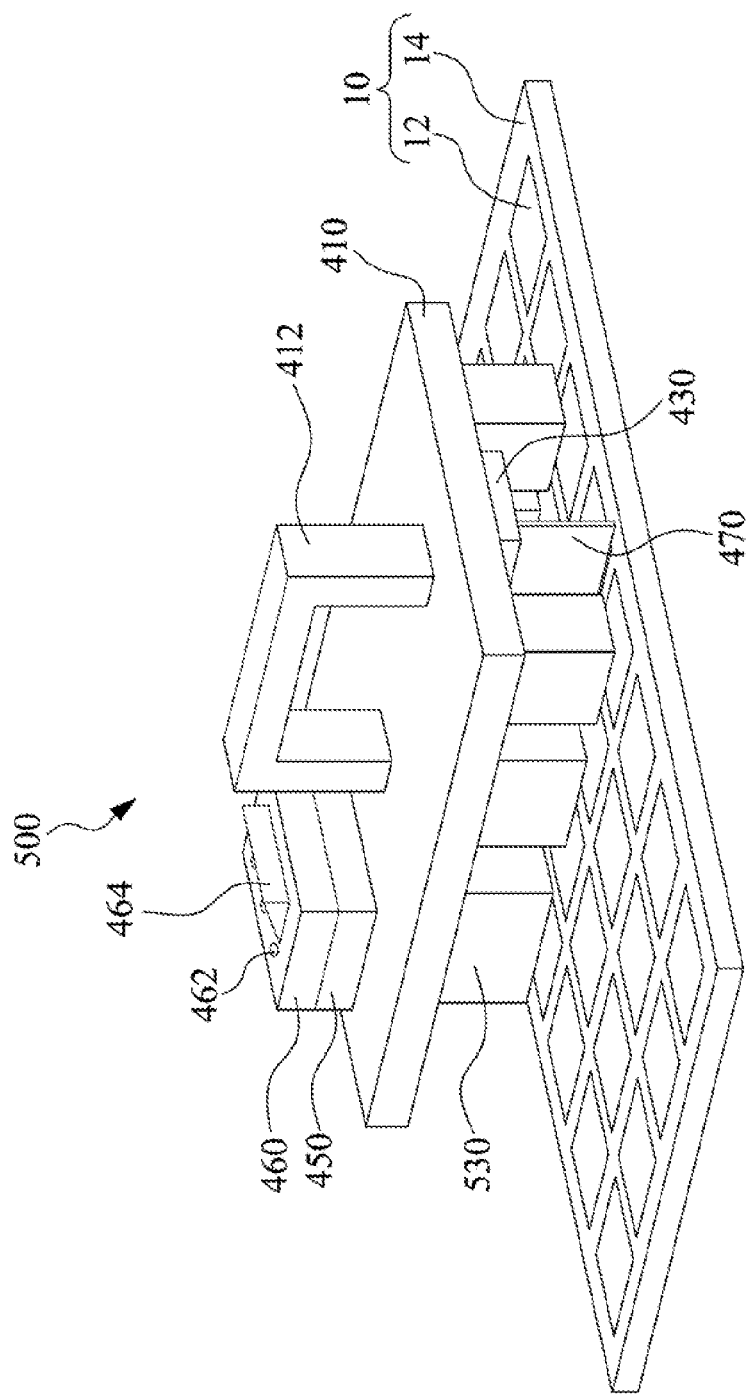
FIG. 4 illustrates a 3D view of a portable device for recovering an efficacy of a solar cell module, in accordance with some embodiments of the present disclosure.

Please refer to FIG. 4, which illustrates a 3D view of a hand-held type device 500, in accordance with some embodiments in the present disclosure. As shown in FIG. 4, the hand-held type device 500 includes a supporting plate 410, a hand-held device 412, a light-beam generator 430, a power supply 450, a control device 460, and a heating device 530. Different from the hand-held type device 400, the hand-held type device 500 further includes the heating device 530. In some embodiments, the heating device 530 is disposed at the lower surface of the supporting plate 410 and is electrically connected to the power supply 450 and the control device 460. In the embodiment, the heating device 530 is disposed at two sides of the light-beam generator 430. In other embodiments, only one side of the light-beam generator 430 has the heating device. It should be noticed that the heating device 530 is used to locally heat the solar cell module 10 for further adjusting the recovering degree of the photovoltaic conversion efficiency of the solar cell module. The heating temperature of the heating device 530 will be discussed in details latter.

Figure 5:
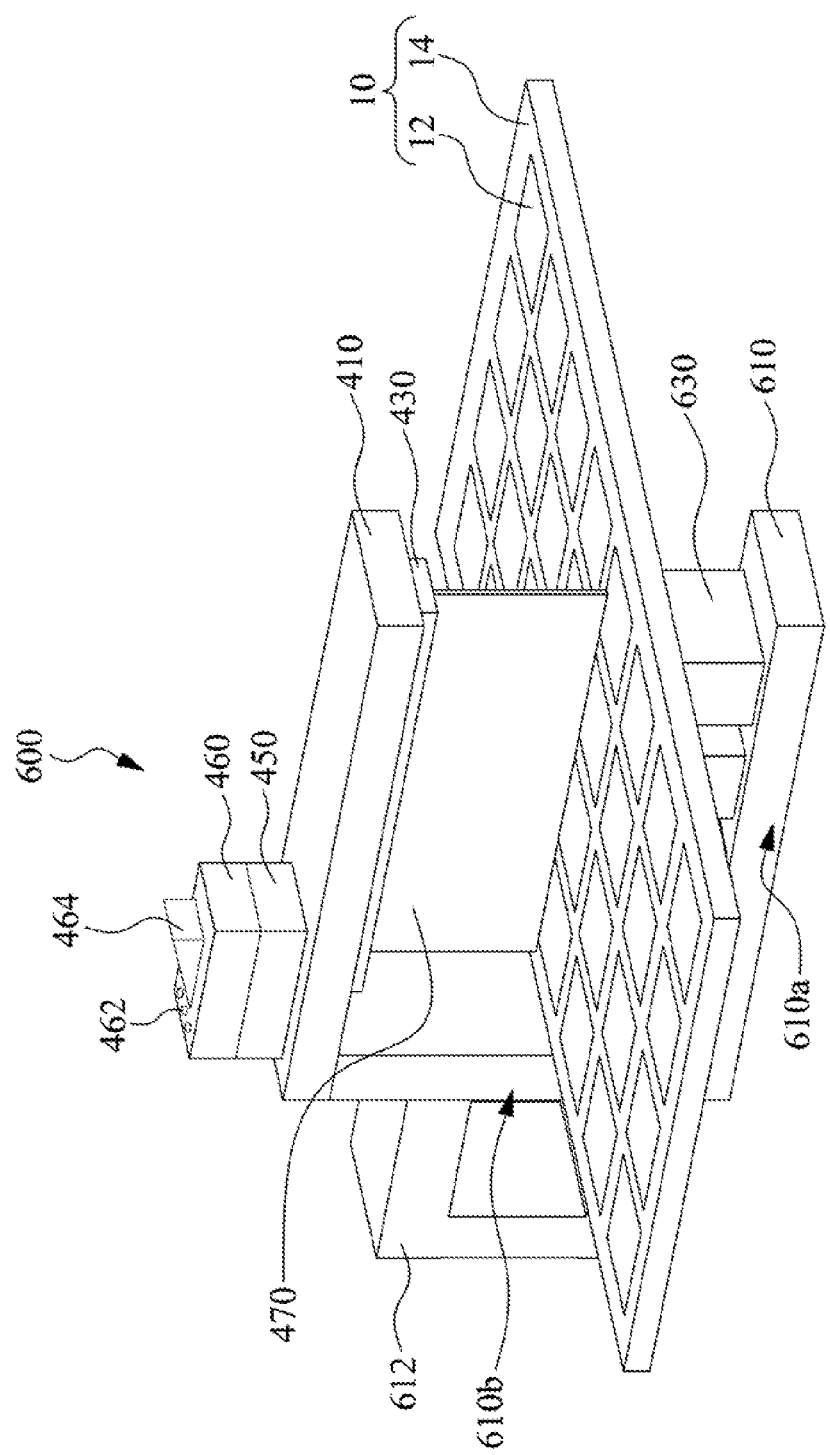
FIG. 5 illustrates a 3D view of a portable device for recovering an efficacy of a solar cell module, in accordance with some embodiments of the present disclosure.

Please refer to FIG. 5, which illustrates a 3D view of a hand-held type device 600, in accordance with some embodiments in the present disclosure. As shown in FIG. 5, the hand-held type device 600 includes a supporting plate 410, a light-beam generator 430, a power supply 450, a control device 460, a L-shape supporting structure 610, a hand-held device 612 and a heating device 630. Different from the hand-held type device 500, the hand-held type device 600 further includes the L-shape supporting structure 610, which is connected to one side of the lower surface of the supporting plate 410. The L-shape supporting structure 610 includes a first portion 610a and a second portion 610b. The first portion 610a is parallel to the supporting plate 410, and the second portion 610b is vertical to the supporting plate 410 and connects the supporting plate 410 and the first portion 610a. Furthermore, the hand-held device 612 is disposed over sidewalls of the second portion 610b, and the heating device 630 is disposed over the upper surface of the first portion 610a and towards the supporting plate 410 for locally heating the solar cell module 10. Different from the heating device 530 of the hand-held type device 500, the heating device 630 of the hand-held type device 600 can heat the back side (i.e. opposite to the front side illuminated by the light-beam 470) of the solar cell module 10 to improve the photovoltaic conversion efficiency of the back side of the solar cell module 10. In other embodiments, one can combine the heating devices in FIG. 4 and FIG. 5 to heat both the front side and the back side of the solar cell module for increasing the heating homogeneity.

The aforementioned light-beam 270, 470 can be, but not limited to, laser or visible light. In some embodiments, the power density of the aforementioned light-beam 270, 470 is between 0.01 W/cm$^2$ and 10000 W/cm$^2$, for example, 0.05 W/cm$^2$, 0.1 W/cm$^2$, 0.5 W/cm$^2$, 1 W/cm$^2$, 5 W/cm$^2$, 10 W/cm$^2$, 20 W/cm$^2$, 30 W/cm$^2$, 40 W/cm$^2$, 50 W/cm$^2$, 60 W/cm$^2$, 70 W/cm$^2$, 80 W/cm$^2$, 90 W/cm$^2$, 100 W/cm$^2$, 125

W/cm$^2$, 150 W/cm$^2$, 175 W/cm$^2$, 200 W/cm$^2$, 300 W/cm$^2$, 400 W/cm$^2$, 500 W/cm$^2$, 750 W/cm$^2$, 1000 W/cm$^2$, 2000 W/cm$^2$, 3000 W/cm$^2$, 4000 W/cm$^2$, 5000 W/cm$^2$, 6000 W/cm$^2$, 7000 W/cm$^2$, 8000 W/cm$^2$, and 9000 W/cm$^2$. In better embodiments, the power density of the light-beam is between 20 W/cm$^2$ and 200 W/cm$^2$.

In some embodiments, the wavelength of the aforementioned light-beam 270, 470 is between 100 nm and 2000 nm, for example, 200 nm, 300 nm, 400 nm, 500 nm, 600 nm, 700 nm, 800 nm, 900 nm, 1000 nm, 1100 nm, 1200 nm, 1300 nm, 1400 nm, 1500 nm, 1600 nm, 1700 nm, 1800 nm, 1900 nm. In better embodiments, the wavelength of the light-beam is between 450 nm and 1100 nm.

In some embodiments, the width of the aforementioned light-beam 270, 470 is between 0.1 mm and 300 mm, for example, 0.1 mm, 0.2 mm, 0.5 mm, 1 mm, 2 mm, 5 mm, 10 mm, 20 mm, 30 mm, 50 mm, 75 mm, 100 mm, 125 mm, 150 mm, 200 mm, 250 mm. In better embodiments, the width of the light-beam is between 1 mm and 156 mm.

In the embodiments, the scanning speed of the aforementioned light-beam 270, 470 is between 10 mm/sec and 500 mm/sec, for example, 25 mm/sec, 50 mm/sec, 75 mm/sec, 100 mm/sec, 125 mm/sec, 150 mm/sec, 175 mm/sec, 200 mm/sec, 250 mm/sec, 300 mm/sec, 350 mm/sec, 400 mm/sec, 450 mm/sec. In better embodiments, the scanning speed of the light-beam is between 50 mm/sec and 200 mm/sec. It should be noticed that the illuminating time of the solar cell module 10 from the light-beam 270, 470 can be precisely controlled by adjustably tuning the width and the scanning speed (i.e. the moving speed of the moving device of the placed type device, or the moving speed of the hand-held type device applied by user) of the light-beam 270, 470 to achieve the best hydrogenating effect. For example, the illuminating time of the solar cell module 10 from the light-beam 270, 470 is between 0.005 second and 3 seconds.

In some embodiments, the heating temperature of the aforementioned heating device 330, 430, 630 is between room temperature and 800° C., for example, 50° C., 100° C., 150° C., 200° C., 250° C., 300° C., 350° C., 400° C., 450° C., 500° C., 550° C. In better embodiments, the heating temperature is between room temperature and 400° C.

In a specific embodiment, the solar cell modules are separated into a control group and a treatment group. The two groups were exposed to light-beam meanwhile and the accumulative exposure energy was 60 KWh/m$^2$, and the photovoltaic conversion efficiencies of the solar cells were measured. Then, the solar cell module of the treatment group was under the hydrogenating process conducted by the aforementioned device for recovering the efficacy of the solar cell module and the related method and parameters. In this hydrogenating process, the power density of the light-beam was 0.1 W/cm$^2$, the wavelength of the light-beam was between 400 nm and 700 nm, the width of the light-beam was between 1 mm and 156 mm, and the scanning speed of the light-beam was between 100 mm/sec and 150 mm/sec. Finally, photovoltaic conversion efficiencies of the solar cell modules in the control group and the treatment group were measured again to compare the difference of the photovoltaic conversion efficiencies between the hydrogenated and the non-hydrogenated solar cell modules, and the measured photovoltaic conversion efficiencies of the solar cell modules are shown in the Table. 1 below.

TABLE 1 photovoltaic conversion efficiencies of the treatment group and the control group.

| Group | Before hydrogenated process | | | After hydrogenated process | | | The amount of change of photovoltaic conversion efficiency (%) |
|---|---|---|---|---|---|---|---|
| | Photovoltaic conversion efficiency (%) | Open-circuit voltage (V) | Short-circuit current (A) | Photovoltaic conversion efficiency (%) | Open-circuit voltage (V) | Short-circuit current (A) | |
| Control group | 18.25 | 0.6504 | 9.6309 | 18.26 | 0.6498 | 9.6240 | 0.04 |
| Treatment group | 18.33 | 0.6504 | 9.6574 | 18.58 | 0.6534 | 9.6930 | 1.40 |

As shown in Table. 1, after the control group and the treatment group are exposed to light-beam and the accumulative exposure energy is 60 KWh/m$^2$, the photovoltaic conversion efficiencies are 18.25% and 18.33% respectively. The photovoltaic conversion efficiency of the non-hydrogenated control group is 18.26% when measured again, which is almost the same of the first-measured value, 18.25%. In comparison, the photovoltaic conversion efficiency of the hydrogenated treatment group increases from 18.33% (non-hydrogenated) to 18.58%, which is elevated 1.40%. Furthermore, as shown in Table. 1, the open-circuit voltage and the short-circuit current of the treatment group improve largely, the former increases from 0.6504V to 0.6534V and the latter increases from 9.6574 A to 9.6930 A. It can be seen that the photovoltaic conversion efficiency of the solar cell module increases largely after being hydrogenated. It is because that the hydrogenating process can improve the degree of LID. It should be noticed that the hydrogenating process in the present disclosure can be applied to the solar cell module before usage, which is not limited to the aforementioned specific embodiment, being used or exposed to a light-beam for a while. For example, the hydrogenating process can be performed to the solar cell module right after manufactured for prevent the efficacy of the solar cell module decreasing largely in the process of the subsequent usage owing to the LID phenomena.

As described in the aforementioned embodiments, the present disclosure has the following advantages. The device for recovering the efficacy of the solar cell module in the present disclosure can perform a hydrogenating process on a solar cell module to improve the degree of light-induced degradation (LID) so as to improve the photovoltaic conversion efficiency of the solar cell module. To be more precise, by using the method for recovering the efficacy of the solar cell module and the device thereof in the present disclosure, the photovoltaic conversion efficiency of the solar cell module can be recovered at least 1.40% after the solar cell module is exposed to a light-beam and the accumulative exposure energy is 60 KWh/m$^2$. Furthermore, the device for recovering the efficacy of the solar cell module can be placed type or hand-held type. The former can be disposed directly on the solar cell module to provide stable hydrogenating process, which includes stable scanning speed of the light-beam and more homogeneous heating temperature. The latter can perform the hydrogenating process to solar cell modules more flexibly according to the real requirements on spot, such as the position of the solar cell module or the size of the working space. Accordingly, the present disclosure provides a simple process for improving the decreasing degree of the photovoltaic conversion efficiency of the solar cell after usage and provides specific portable devices for performing the aforementioned improving methods.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A portable device for recovering an efficacy of a solar cell module, comprising:
   a dam structure having two trenches disposed on an inner sidewall of the dam structure in parallel;
   a plate structure, two ends of the plate structure connected to two moving devices respectively, and the moving devices in the trenches;
   a light-beam generator disposed at a lower surface of the plate structure; and
   a power supply disposed on sidewalls of the dam structure and electrically connected to the light-beam generator and the moving devices.

2. The device of claim 1, further comprising a heating device disposed at one side or two sides of the light-beam generator.

3. The device of claim 1, further comprising a control device disposed on sidewalls of the dam structure and electrically connected to the light-beam generator and the moving devices.

* * * * *